United States Patent
Dreano et al.

(10) Patent No.: US 11,511,349 B2
(45) Date of Patent: Nov. 29, 2022

(54) METHOD FOR MANUFACTURING A WORKPIECE BY ADDITIVE MANUFACTURING

(71) Applicant: SAFRAN AIRCRAFT ENGINES, Paris (FR)

(72) Inventors: Sébastien Vincent François Dreano, Moissy-Cramayel (FR); Tiphaine De Tinguy, Moissy-Cramayel (FR); Michel Daniel Régis Sers, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 0 days.

(21) Appl. No.: 17/054,592

(22) PCT Filed: Jul. 2, 2019

(86) PCT No.: PCT/FR2019/051634
§ 371 (c)(1),
(2) Date: Nov. 11, 2020

(87) PCT Pub. No.: WO2020/008137
PCT Pub. Date: Jan. 9, 2020

(65) Prior Publication Data
US 2021/0187615 A1 Jun. 24, 2021

(30) Foreign Application Priority Data
Jul. 2, 2018 (FR) ........................................ 1856085

(51) Int. Cl.
*B22F 10/47* (2021.01)
*B33Y 10/00* (2015.01)
(Continued)

(52) U.S. Cl.
CPC .............. *B22F 10/47* (2021.01); *B22F 10/40* (2021.01); *B22F 10/80* (2021.01); *B33Y 10/00* (2014.12);
(Continued)

(58) Field of Classification Search
CPC .......... B22F 10/47; B22F 10/40; B22F 10/80; B22F 10/28; B22F 10/20; B22F 10/30;
(Continued)

(56) References Cited

U.S. PATENT DOCUMENTS

2013/0112366 A1* 5/2013 Mottin .................... B23P 15/02
   164/494
2018/0162060 A1* 6/2018 Mark ...................... B22F 10/64

FOREIGN PATENT DOCUMENTS

CN      205209880 U  *  5/2016
WO      2012001324 A1    1/2012

OTHER PUBLICATIONS

F. Calignano, "Design optimization of supports for overhanging structures in aluminum and titanium alloys by selective laser melting", Materials and Design 64 (2014) 203-213 (Year: 2014).*
(Continued)

*Primary Examiner* — Thomas C Lee
*Assistant Examiner* — Michael Tang
(74) *Attorney, Agent, or Firm* — Bookoff McAndrews, PLLC

(57) ABSTRACT

A method for manufacturing a part by additive manufacturing, the part to be manufactured including at least one portion to be held forming an angle of less than 45° with respect to a building direction of the part to be manufactured, the portion to be held having a first lateral surface and a second lateral surface opposite each other, the method comprising the steps of: providing a digital model of the part to be manufactured, adding to the digital model at least one
(Continued)

holding element positioned on one side of the portion to be held, so as to be in contact with said first lateral surface or said second lateral surface.

18 Claims, 3 Drawing Sheets

(51) Int. Cl.
*B33Y 50/00* (2015.01)
*G06F 30/17* (2020.01)
*B22F 10/80* (2021.01)
*F01D 5/14* (2006.01)
*G05B 19/4099* (2006.01)
*B22F 10/40* (2021.01)
*B22F 10/28* (2021.01)

(52) U.S. Cl.
CPC ............... *B33Y 50/00* (2014.12); *F01D 5/14* (2013.01); *G05B 19/4099* (2013.01); *G06F 30/17* (2020.01); *B22F 10/28* (2021.01); *F05D 2230/68* (2013.01); *F05D 2240/30* (2013.01); *F05D 2260/81* (2013.01); *G05B 2219/35134* (2013.01); *G05B 2219/49023* (2013.01)

(58) Field of Classification Search
CPC ........... B22F 5/04; B33Y 10/00; B33Y 50/00; B33Y 50/02; B33Y 80/00; F01D 5/14; G05B 19/4099; G05B 2219/35134; G05B 2219/49023; G06F 30/17; G06F 30/00; F05D 2230/68; F05D 2240/30; F05D 2260/81; F05D 2230/13; Y02P 10/25
See application file for complete search history.

(56) References Cited

OTHER PUBLICATIONS

"Inside Metal Additive Manufacturing" Design for supports in metal selective laser melting—Feb. 14, 2015, (2 pages).
F. Calignano "Design optimization of supports for overhanging structures in aluminum and titanium alloys by selective laser melting" Materials and Design, vol. 64, pp. 203-213 (2014).
International Search Report in corresponding Application No. PCT/FR2018/051634, dated Oct. 24, 2019, (3 pages).

* cited by examiner

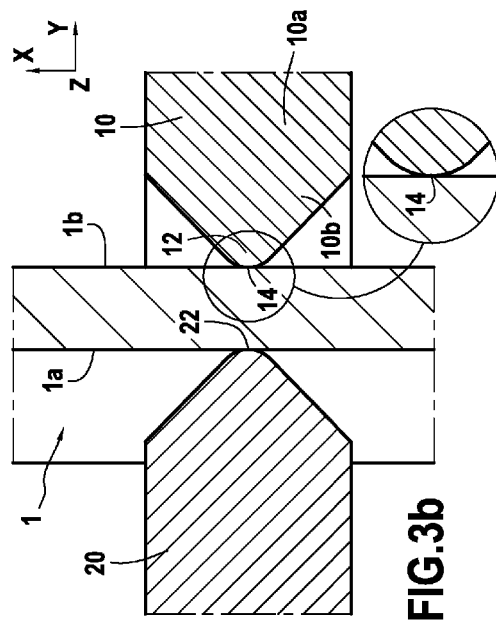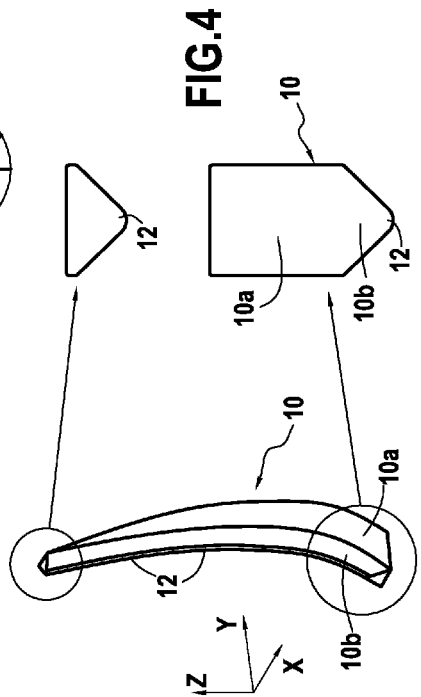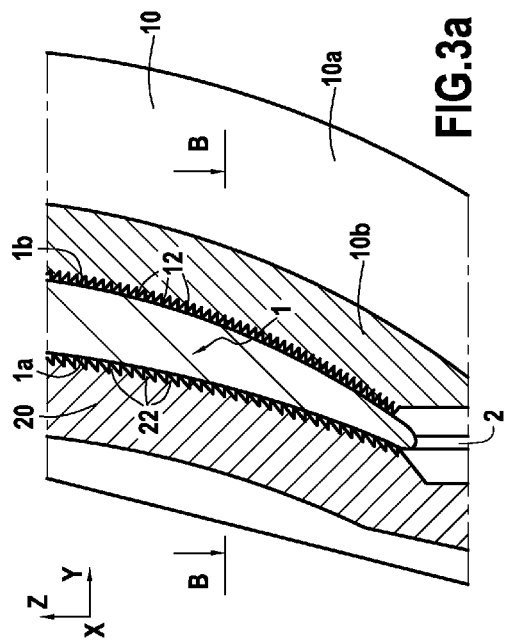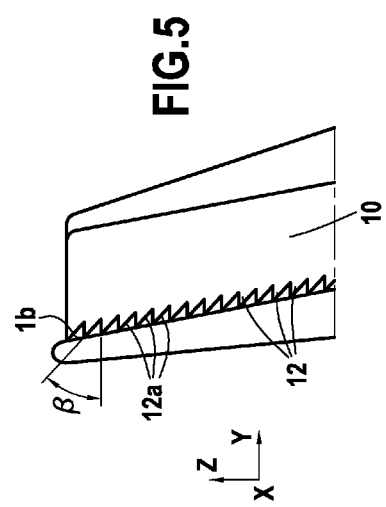

METHOD FOR MANUFACTURING A WORKPIECE BY ADDITIVE MANUFACTURING

CROSS-REFERENCE TO RELATED APPLICATION(S)

This application is the U.S. national phase entry under 35 U.S.C. § 371 of International Application No. PCT/FR2019/051634, filed on Jul. 2, 2019, which claims priority to French Patent Application No. 1856085, filed on Jul. 2, 2018.

FIELD OF THE INVENTION

The present disclosure relates to a method for manufacturing a part by additive manufacturing, that allows holding some surfaces of the part likely to deform during manufacture, and in particular the surfaces affecting the aerodynamics of the final part.

Such an additive manufacturing method is particularly suitable for manufacturing complex parts provided with sensitive surfaces, intended in particular for the aeronautical field.

State of the Prior Art

It is now known, in the aeronautical field in particular, to use additive manufacturing methods for the production of some parts whose geometry is fine or complex.

A conventional example of additive manufacturing is the manufacture by melting or sintering of powder particles by means of a high-energy beam. Among these high-energy beams, the laser beam and the electron beam can in particular be mentioned.

By "Selective Laser Melting" (SLM), also known under the process name "Laser Beam Melting" (LBM), it is meant a process whose main characteristics are recalled below with reference to FIG. 1 illustrating a conventional device for manufacturing a part by selective melting or selective sintering of powder beds by means of a laser beam.

For example, using a spreading tool 200 (for example a roller), a first layer 100a of powder of a material is deposited on a building tray 210 (it may be a tray alone or surmounted by a massive support, a portion of another part or a support grid used to facilitate the building of some parts).

This powder is transferred from a feed bin 220 during a forward movement of the roller 200 then it is scraped, and possibly slightly compacted, during one (or several) return movement(s) of the roller 200. The powder is composed of particles 110. The excess powder is collected in a recycling bin 230 located adjacent to the building bin 240 in which the building tray 210 moves vertically.

A laser beam 310 generator 300 and a control system 320 able to direct this beam 310 onto any region of the building tray 210 so as to scan any region of a layer of powder previously deposited are also used. The shaping of the laser beam 310 and the variation of its diameter on the focal plane occur respectively by means of a beam expander 340 or focusing system 330, the whole constituting the optical system.

Then, a region of this first layer 100a of powder is brought, by scanning with a laser beam 310, to a temperature greater than the melting temperature of this powder.

This type of additive manufacturing method can use any high-energy beam instead of the laser beam 310, and in particular an electron beam, as long as this beam is sufficiently energetic to melt the powder particles and part of the material on which the particles rest.

This scanning of the beam is performed for example by a galvanometric head forming part of a control system 320. For example this control system comprises at least one orientable mirror 350 on which the laser beam 310 is reflected before reaching a layer of powder, each point of the surface of which is always located at the same height with respect to the focusing lens, contained in the focusing system 340, the angular position of this mirror being controlled by a galvanometric head so that the laser beam scans at least one region of the first layer of powder, and thus follows a pre-established part profile. To do so, the galvanometric head is driven based on the information contained in the database of the computer tool used for the computer-aided design and manufacture of the part to be manufactured.

Thus, the powder particles 110 of this region of the first layer 100a are melted and form a first integral element 120a, secured to the building tray 210. At this stage, it is also possible to scan with the laser beam several independent regions of this first layer to form, after melting and solidification of the material, several first elements 120a disjoint from each other.

The building tray 210 is lowered by a height corresponding to the thickness of the first layer of powder 100a (20 to 100 μM and generally from 30 to 50 μM).

A second layer 100b of powder is then deposited on the first layer 100a and on this first integral or consolidated element 120a, then a region of the second layer 10b which is located partially or completely above this first integral or consolidated element 120a in the case illustrated in FIG. 1 is heated by exposure to the laser beam 310, so that the powder particles of this region of the second layer 100b are melted with at least part of the element 120a and form a second integral or consolidated element 120b, the set of these two elements 120a and 120b forming, in the case illustrated in FIG. 1, an integral block.

Such an additive manufacturing technique therefore ensures excellent control of the geometry of the part to be manufactured and allows producing parts with great complexity.

However, when producing parts with a complex geometry, some portions of the part are momentarily strongly cantilevered or even without any holding other than the volume of non-solidified powder located below, and are therefore likely to collapse in the manufacturing bin. This is in particular the case with the portions of the part that are substantially parallel to the manufacturing tray. In such a case, it is then necessary to manufacture supports at the same time as the part in order to hold these portions during the manufacturing phase.

However, when the manufacture is complete, and upon removal of these supports, residues remain at the interface between the supports and the part. Consequently, the obtained part includes areas whose surface state is not homogeneous. This non-homogeneous surface state, when it concerns sensitive areas of the part (for example the areas in contact with an air stream), can disturb the flow of the fluid and thus alter the aerodynamic properties and therefore the efficiency of the concerned machine.

In order to avoid this problem, one solution consists in orienting the part in such a way as to limit the use of supports, for example by disposing the largest surface in a substantially vertical manner.

However, when producing parts with a slender geometry, that is to say long and thin parts in which one dimension is much greater than another dimension, for example an airfoil, some surfaces tend to deform during manufacture, by buckling under the effect of the stresses resulting from the cooling and solidification of the molten area. This deformation can give rise to shape deviations on the order of 4 mm on the aerodynamic profiles, which can alter their aerodynamic properties. In order to limit these deformations, and limit the need for the supports, it is also possible to dispose the part, for example the airfoil, by positioning the largest dimension vertically, that is to say by positioning the leading edge and the trailing edge vertically. However, this disposition greatly increases the manufacturing time.

There is therefore a real need for a method for manufacturing a part by additive manufacturing, that allows holding some particularly sensitive surfaces of the part and in particular the surfaces affecting the aerodynamics of the final part, while limiting the presence of residues on these surfaces during the manufacture of the part.

Presentation of the Invention

The present disclosure relates to a method for manufacturing a part by additive manufacturing, the part to be manufactured including at least one portion to be held forming an angle of less than 45° with respect to a building direction of the part to be manufactured, the portion to be held having a first lateral surface and a second lateral surface opposite each other, the method comprising the following steps:

providing a digital model of the part to be manufactured, adding to the digital model at least one holding element positioned on one side of the portion to be held, so as to be in contact with said first lateral surface or said second lateral surface.

In some embodiments, the digital model includes at least two holding elements, a first holding element being positioned on a first side of the portion to be held, so as to be in contact with said first lateral surface and a second holding element being positioned on a second side of the portion to be held so as to be in contact with said second lateral surface.

In the present disclosure, by "building direction", it is meant the direction in which the part is built, that is to say in which the layers of powder or manufacturing layers, are stacked on each other. For example, when the part is manufactured on a building tray, the building direction corresponds to a direction orthogonal to said building tray. By "building plane", it is meant a plane orthogonal to the building direction and substantially parallel to the building tray. In addition, by "in contact", it is meant that the holding element is directly in contact with the lateral surface, or with a clearance of less than 0.1 mm.

Preferably, a main direction of the part to be manufactured forms an angle of less than 30° with respect to the building direction. In a case where the part to be manufactured would be a plate, for example, the plate having two lateral surfaces opposite each other would be disposed so as to form an angle of less than 30° with respect to the building direction, i.e. that is to say with respect to the direction orthogonal to the building tray. In other words, the plate would be disposed substantially vertically or sub-vertically with respect to the building tray.

The addition of at least two holding elements to the digital model allows building these holding elements by additive manufacturing, at the same time as the part to be manufactured. The two holding elements are disposed on either side of the portion to be held and in contact therewith so as to sandwich it. In other words, while a lower portion of the part to be manufactured is supported either by a support element or directly by the building tray, the holding elements allow holding the lateral surfaces of the portion to be held of the part to be manufactured.

The presence of these holding elements allows avoiding a deformation of the part during manufacture, by buckling under the effect of the stresses of the cooling and solidification of the molten area. It is thus possible to accurately position the holding elements against the part, based on the modes of deformation of the latter. In the case of an aeronautical part, these holding elements thus allow limiting the modification of the aerodynamic properties of this part.

In some embodiments, the contact between the first holding element and the first lateral surface, and the contact between the second holding element and the second lateral surface, are linear contacts.

By "linear contact", it is meant a contact following a straight or curved line in a given plane, the line being continuous or discontinuous. In other words, the linear contact can take the form of a succession of point contacts, insofar as these point contacts are aligned on the same line. The presence of these linear contacts between the holding elements and the lateral surfaces allows limiting the contact surface between the holding elements and the lateral surfaces. Thus, when the manufacture of the part is complete, it is possible to easily detach the holding elements from these lateral surfaces, while limiting the presence of residues thereon, caused by these elements. The final part obtained thus has a homogeneous surface state. It is therefore possible to do without a step of manually polishing these surfaces after obtaining the final part.

In some embodiments, the first and second holding elements face each other.

By "face each other", it is meant that the first and second holding elements are disposed on each side of the portion to be held, but are both comprised in the same plane, said plane being substantially perpendicular to the portion to be held and parallel to the building direction. This disposition allows improving the holding of the portion to be held during manufacture, further limiting the deformation thereof, by stressing its shape on a given section.

In some embodiments, a contact end of at least one holding element, in contact with the corresponding lateral surface of the portion to be held, has a thinned shape.

By "thinned shape", it is meant that in a transverse plane of the holding element, the transverse plane being perpendicular to the building direction, the contact end is thinner, that is to say less thick, than the rest of the holding element. For example, the contact end may be rounded. By "rounded", it is meant that the contact end is rounded in the transverse plane of the holding element. This thinned shape, for example rounded, allows further limiting the contact surface between the holding element and the corresponding lateral surface of the portion to be held. This allows further limiting the presence of residue after removal of the holding element. In addition, this rounded shape allows facilitating the operation of manual removal of the holding element.

In some embodiments, at least one holding element includes a plurality of teeth aligned with respect to each other, said holding element being positioned such that the teeth are in contact with the corresponding lateral surface of the portion to be held.

According to this configuration, the contact between the holding element and the corresponding lateral surface of the portion to be held is a discontinuous linear contact. In a plane parallel to the building direction and perpendicular to the lateral surfaces, the plurality of teeth of the holding element may for example take the form of saw teeth.

Furthermore, when the contact ends of the teeth of the holding element, in contact with the corresponding lateral surface of the portion to be held, are rounded, said contact is in the form of a succession of contact points aligned with respect to each other along a line. This configuration allows further limiting the contact surface between the holding element and the corresponding lateral surface of the portion to be held, and thus further limiting the presence of residue after removal of the holding element.

In some embodiments, the teeth of at least one holding element are aligned with respect to each other along a direction part of a plane comprising the building direction of the part to be manufactured.

In other words, the teeth can be aligned along a straight line, but can also be aligned along a curved line, the latter being part of a plane comprising the building direction, that is to say perpendicular to the building tray. This configuration allows limiting more effectively the deformation of the part to be manufactured.

In some embodiments, at least one holding element has, along the building direction of the part to be manufactured, a decreasing section.

The section of the considered holding element is a cross section, that is to say a section perpendicular to the building direction. According to this configuration, the section of the holding element decreases as moving away from the building tray along the building direction. In other words, a portion of the holding element closer to the building tray is more massive than a portion of the holding element further away from the building tray. Given the fact that the part to be manufactured tends to deform under the effect of the cooling stresses accumulated throughout the manufacture and successive layers, the need to hold the latter is greater towards the bottom of the part, that is to say close to the building tray, thus requiring a sufficiently rigid holding element in order to limit the deformations in this area. Conversely, the rigidity of the holding element may be lower in areas further away from the building tray. The fact of adapting the section of the holding element based on the deformation stresses exerted by the portion to be held along the height thereof allows limiting the amount of material used to manufacture the holding element. This configuration thus allows limiting the manufacturing costs of the part and its holding elements, as well as the manufacturing time.

In some embodiments, the contact line between at least the holding element and the corresponding lateral surface extends over the entire height of the portion to be held.

The height of the portion to be held is considered along the building direction, that is to say the direction perpendicular to the building tray. This configuration allows improving the holding of the portion to be held and limiting its deformation more effectively.

In some embodiments, the digital model includes a plurality of first holding elements in contact with the first lateral surface of the portion to be held, and a plurality of second holding elements in contact with the second lateral surface of the portion to be held.

These holding elements can be distributed evenly over each lateral surface of the portion, but can also be distributed unevenly, as needed. For example, the number of elements in contact with either of the lateral surfaces may be greater in the areas of these surfaces where the part presents a greater risk of deformation, and vice versa. This configuration allows optimizing the holding of the portion to be held, based on the modes of deformation thereof.

In some embodiments, each first holding element of the plurality of first holding elements in contact with the first lateral surface of the portion to be held, is positioned facing one of the second holding elements of the plurality of second holding elements in contact with the second lateral surface of the portion to be held.

By "facing", it is meant that the holding elements are disposed two by two on each side of the portion to be held, both being comprised in the same plane, said plane being substantially perpendicular to the portion to be held and parallel to the building direction. This disposition allows improving the holding of the portion to be held during manufacture by fixing its shape on given sections.

In some embodiments, each first holding element of the plurality of first holding elements in contact with the first lateral surface of the portion to be held is positioned in a staggered manner relative to the second holding elements of the plurality of second holding elements in contact with the second lateral surface of the portion to be held.

By "staggered manner", it is meant that the first holding elements are not facing one of the second holding elements. In other words, the first and second holding elements are offset from each other in a longitudinal direction, parallel to the building plane. This disposition allows optimizing the position of the holding elements depending on the buckling of the part.

In some embodiments, at least one tooth of at least one holding element includes a face having an angle comprised between 30° and 70°, preferably comprised between 40° and 60°, with respect to the building direction.

In some embodiments, at least 50% of the teeth of at least one holding element, preferably at least 80% of the teeth, more preferably all the teeth, include a face having an angle comprised between 30° and 70°, preferably comprised between 40° and 60°.

The angles of inclination of these surfaces allow avoiding placing supports thereon. Indeed, it is known that from a building angle of approximately 30° relative to the building tray, the layer of the part being manufactured benefits from sufficient grip on the solidified portion of the lower manufacturing layer to be able to be held in position during the manufacture of the part, without the need for additional holding means. It is therefore not necessary to place supports on said surface. Thus, by orienting the model such that these surfaces have these angles of inclination, the teeth of the holding element are unlikely to collapse under their own weight during manufacture, it thus not necessary to place supports.

In some embodiments, at least one holding element comprises a shell portion entirely wrapping the first lateral surface of the portion to be held and/or the second lateral surface of the portion to be held, such that a clearance exists between the shell portion and the lateral surface(s), the shell portion having bearings in contact with the lateral surface(s), the contact being linear.

The shell has an inner surface whose shape matches that of the corresponding lateral surface of the portion to be held, these two surfaces facing each other and being separated by a clearance comprised between 0.1 and 0.5 mm. It is known to use a shell of this type, having a smooth surface, in order to limit the overall deformations of the part. However, the shell according to the present disclosure also has on its inner surface bearings including for example a plurality of teeth in contact with the corresponding lateral surface, in the same way as the holding elements. The presence of this shell including these bearings allows further limiting the deformations of the part during manufacture, including in the areas of the portion to be held that are not held by the bearings. In the case of parts with strong buckling areas, this shell thus allows avoiding disposing holding elements over the entire length of the part.

In some embodiments, the shell portion includes a plurality of orifices.

The orifices allow recovering the powder more easily and recycling the powder not used at the end of manufacture.

In some embodiments, the portion to be held of the part to be manufactured has a slender face.

By "slender" it is meant a part whose at least one dimension is at least 10 times, preferably at least 50 times greater than another dimension. For example, a planar plate can have a length and a width much greater than its thickness.

In some embodiments, the part to be manufactured is an aeronautical part, particularly a turbomachine part, and the lateral surfaces of the portion to be held are surfaces intended to be in contact with a stream of a working fluid.

The surfaces intended to be in contact with a stream of a working fluid can be surfaces delimiting a flowpath for the working fluid in a turbomachine, for example. The presence of the holding elements therefore allows limiting the deformation of these surfaces during manufacture, and thus limiting the risks of degradation of the performances of the turbomachine.

In some embodiments, the part to be manufactured is a turbomachine airfoil, the first lateral surface being the intrados of the airfoil, the second lateral surface being the extrados of the airfoil.

According to this configuration, the surface to be held, including the intrados and the extrados, is oriented such that the angle it forms with respect to the building direction, depending on the curvature of the intrados and the extrados, remains less than 45°. Moreover, considering that the main direction of the airfoil is the chord thereof, the chord forms an angle of less than 30° with respect to the building direction. During the manufacture, the leading edge of the airfoil can bear either on a support or directly on the building tray, the building of the airfoil therefore starting with its leading edge, and going layer after layer up to its trailing edge, along the building direction. In this case, the holding elements, and more specifically the linear contacts between them and the airfoil, follow the curvature of the intrados and the extrados. The use of these holding elements to hold the intrados and the extrados of the airfoil during the manufacture thereof allows limiting a deformation, generating the modification of the curvature thereof, and therefore a modification of its aerodynamic properties. In addition, these holding elements allow, after their removal, limiting the presence of residues on the intrados and the extrados of the airfoil. It is therefore possible to do without a step of manually polishing these surfaces after obtaining the final airfoil.

In some embodiments, the method further comprises: a step of producing the part to be manufactured layer by layer using an additive manufacturing technique based on the digital model, and a step of removing the holding elements.

In some embodiments, the method further comprises, after removal of the holding elements, a step of automatically polishing the surface to be spared of the part thus obtained.

Although the holding elements described in the previous embodiments allow limiting the presence of residues after removal thereof, the step of automatically polishing the surface to be spared of the part obtained allows further improving the homogeneity of said surface.

This present disclosure also relates to a draft including:
a part having at least one portion to be held forming an angle of less than 45° with respect to a building direction of the part, the portion to be held having a first lateral surface and a second lateral surface opposite each other, and
at least two holding elements, a first holding element being positioned on a first side of the portion to be held, so as to be in contact with said first lateral surface and a second holding element being positioned on one side of the portion to be held so as to be in contact with said second lateral surface.

BRIEF DESCRIPTION OF THE DRAWINGS

The invention and its advantages will be better understood upon reading the detailed description given below of various embodiments of the invention given by way of non-limiting examples. This description refers to the pages of appended figures, on which:

FIG. 2b represents a cross section along A-A of the part of FIG. 2a;

FIG. 3a represents the cross section of FIG. 2b, including holding elements according to the present disclosure, and FIG. 3b represents a sectional view of FIG. 3a along the line B-B;

FIG. 4 represents a perspective view of a holding element according to the present disclosure;

FIG. 5 represents a cross section of an upper portion of the part to be manufactured.

DETAILED DESCRIPTION OF EXEMPLARY EMBODIMENTS

In the remainder of the description, the height of the part to be manufactured is considered along the vertical direction Z, corresponding to the building direction. Consequently, the terms "upper", "lower" and their derivatives are considered along this direction Z. Furthermore, a longitudinal direction of the part to be manufactured is considered along a horizontal direction X, perpendicular to the vertical direction Z. In addition, the thickness of the part to be manufactured is considered along a direction Y, perpendicular to the direction X and to the direction Z.

Furthermore, for the sake of simplicity, it will be understood in the remainder of the description that any reference to the airfoil or to the holding elements actually refers to the digital model of the part to be manufactured, the digital model including said airfoil and said holding elements.

Figure 1:
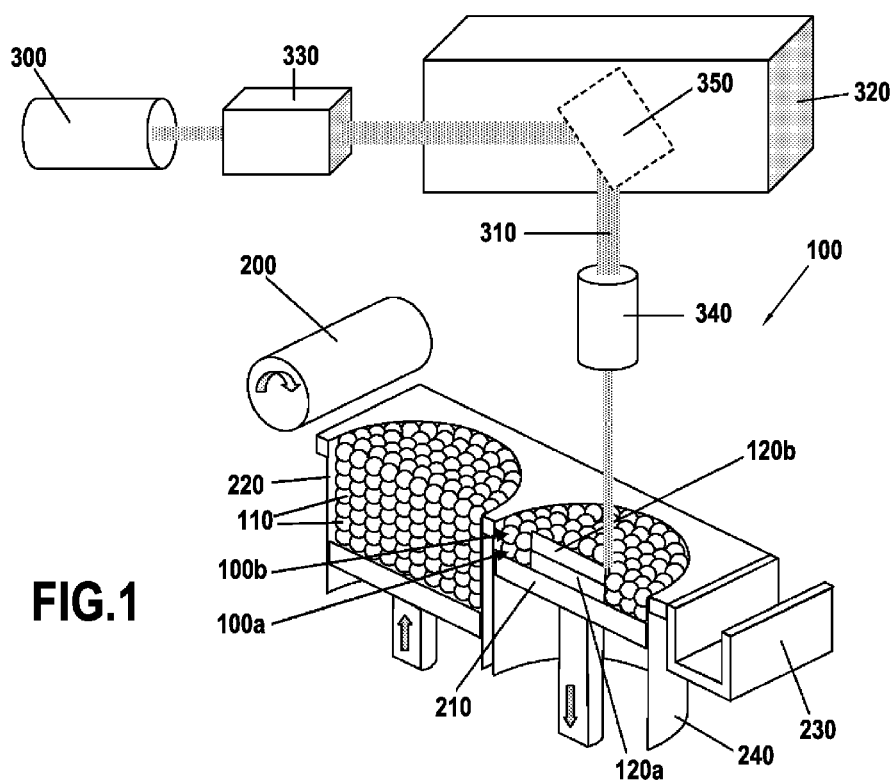
FIG. 1 represents an overview of an additive manufacturing device by selective melting of powder beds.
Figure 2A:
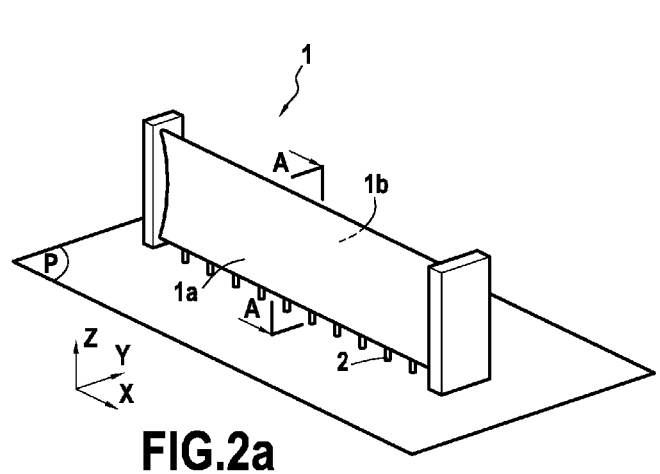
FIG. 2a represents a perspective view of a digital model of a part to be manufactured.

FIG. 2a represents a perspective view of a model 1 of a part to be manufactured on a building tray P, by a method for manufacturing a part by additive manufacturing. The building direction, corresponding to the vertical axis Z, is perpendicular to the building plane, corresponding to the upper surface of the building tray P. In this embodiment, the part to be manufactured 1 is a turbomachine airfoil. The airfoil 1 includes an intrados 1a and an extrados 1b. The intrados 1a and the extrados 1b are lateral surfaces of the portion to be held during the manufacture of the airfoil 1 by additive manufacturing.

Indeed, during the manufacture of the airfoil 1 by additive manufacturing, the intrados 1a and the extrados 1b of the airfoil 1 extend substantially along the vertical direction Z, a lower end of the airfoil 1, for example the trailing edge, being supported by at least one support 2, or resting directly on the building tray P. More specifically, the model of the airfoil 1 is oriented such that the chord of the airfoil forms an angle preferably less than 30° with respect to the building direction, that is to say the vertical direction Z.

Figure 2B:
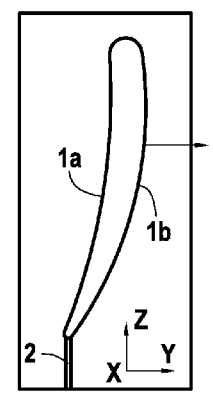

FIG. 3a represents a lower portion of the cross section of FIG. 2b, in which holding elements 10 and 20 are disposed on either side of the airfoil 1. The holding element 10 is an extrados holding making it possible to hold the extrados 1b of the airfoil 1 during manufacture, and the holding element 20 is an intrados holding making it possible to hold the intrados 1a of the airfoil 1 during manufacture. In this embodiment, each holding element 10, 20 is supported by the building tray P, and is in contact with the airfoil 1 along a contact line extending over the entire height thereof, that is to say from the leading edge to the trailing edge thereof. Alternatively, the holding elements 10, 20 can be in contact with the airfoil 1 only over a portion of the height thereof. Furthermore, the holding elements 10 and 20 are disposed such that they are aligned with each other along the thickness direction Y (see FIG. 3b). In other words, the contact line between the intrados holding element 20 and the intrados 1a, and the contact line between the extrados holding element 10 and the extrados 1b, are both comprised in the plane YZ.

FIG. 4 represents a perspective view of an extrados holding element 10 according to the present disclosure. The holding element 10 extends mainly along the building direction, following the shape, or more specifically the curvature, of the extrados 1b of the airfoil 1. The holding element 10 includes a structural portion 10a, and a contact portion 10b. One end of the contact portion 10b is provided to be in contact with the extrados 1b of the airfoil 1. The contact portion 10b has a converging shape from the structural portion 10a up to the end in contact with the extrados 1b. The structural portion 10a is the portion of the holding element that allows limiting the deformations thereof. In other words, the structural portion 10a allows giving the holding element 10 sufficient rigidity to resist the deformations of the airfoil 1.

The right portion of FIG. 4 has cross sections of the holding element 10 perpendicular to the building direction, on a lower portion and an upper portion thereof. The structural portion 10a and the contact portion 10b have a width, that is to say a dimension along the longitudinal direction X, substantially constant and small compared to their dimension along the vertical direction Z. On the other hand, the thickness, that is to say the dimension along the direction Y, of the structural portion 10a, decreases along the building direction, from the lower end up to the upper end of the holding element 10. In other words, the total section of the holding element 10 is decreasing along the building direction. Indeed, the need to hold it is greater in the lower portions, that is to say, close to the building tray, requiring the holding element 10 to be more rigid in order to limit the deformations in this area. Conversely, the rigidity of the holding element 10 may be lower in the upper portions of the airfoil 1.

In addition, the end of the contact portion 10b, in contact with the extrados 1b, includes a plurality of teeth 12. Each holding element may include between three to ten teeth 12 per cm along the line according to which the teeth 12 are aligned. The teeth 12 are aligned with respect to each other in a plane perpendicular to the longitudinal axis X, such that a discontinuous linear contact, in the form of a succession of point contacts, is established between the extrados 1b and the holding element 10, over the entire height of the extrados. Along a cross section perpendicular to the longitudinal axis X, corresponding to the view of FIGS. 3a and 5, the teeth 12 have the shape of saw teeth. More specifically, each tooth 12 includes a bearing face 12a, the bearing face 12a having, in this section, an angle β comprised between 30° and 70°, preferably comprised between 40° and 60°, more preferably equal to 45°, with respect to the horizontal, that is to say with respect to the building plane. This angle allows avoiding placing supports thereon.

Furthermore, along a cross section perpendicular to the axis Z, corresponding to the view of FIG. 3b, each tooth 12 includes a rounded end 14. Thus, the linear contact between the extrados 1b and the holding element 10 is in the form of a succession of contact points aligned with respect to each other over the entire height of the airfoil 1. This rounded shape allows limiting the contact surface between the holding element 10 and the extrados 1b, and thus limiting the presence of residue after removal of the holding element 10.

Although not described in detail, the intrados holding elements 20 have the same structural characteristics as the extrados holding element 10, except that the curvature of the intrados holding element 20 follows the curvature of the intrados 1a. The end of the contact portions in contact with the intrados 1a, in particular includes a plurality of teeth 22.

Furthermore, FIGS. 3a and 3b represent sections of the airfoil 1 in which a single extrados holding element 10 and a single intrados holding element 20 are visible. However, the digital model may include two or more extrados holding elements 10 along the longitudinal direction X, and two or more intrados holding elements 20 along the longitudinal direction X. The number of holding elements each side of the airfoil as well as their positions, are determined depending on the needs that is to say depending on the portions of the airfoil that are most likely to be deformed during manufacture.

Figure 6:
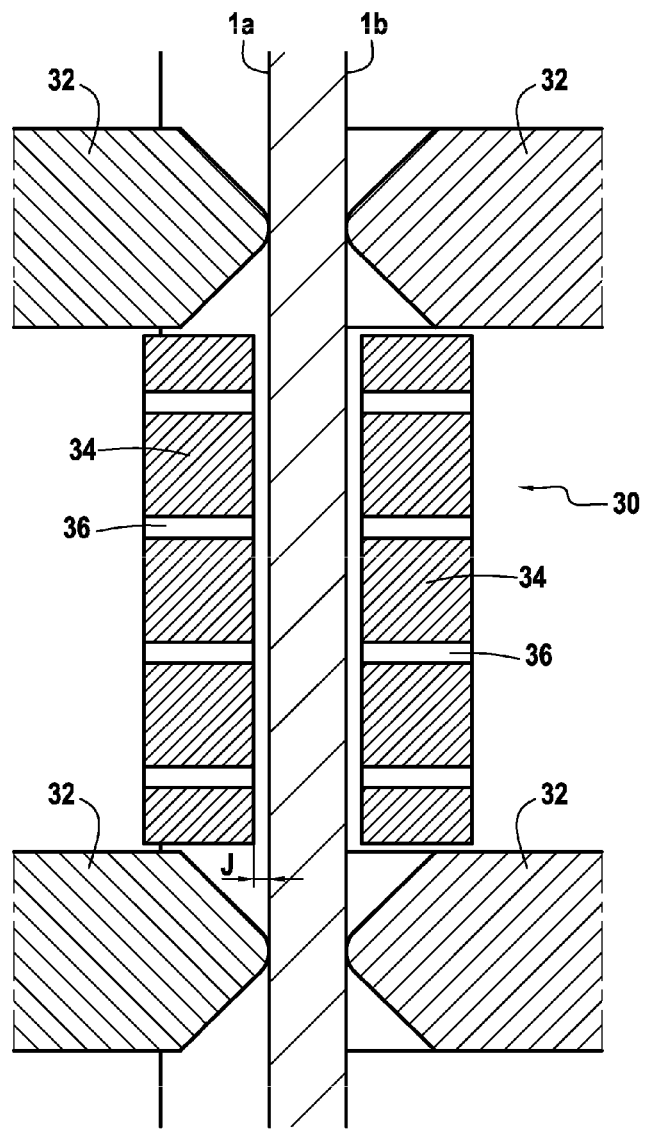
FIG. 6 represents a sectional view of the part to be manufactured and of a shell.

FIG. 6 represents a sectional view of the part to be manufactured according to another embodiment in which, instead of the holding elements 10, 20, a shell 30 is disposed on either side of the part to be manufactured. The shell 30 includes bearings 32 having the same characteristics as the holding elements 10, 20, in particular a plurality of aligned teeth in contact with the lateral surfaces 1a, 1b of the portion to be held. The shell also includes intermediate portions 34 between two adjacent bearings 32. The intermediate portions 34 have a surface whose shape matches that of the corresponding lateral surface 1a, 1b of the portion to be held, these two surfaces facing each other. The intermediate portions 34 are not in contact with the lateral surfaces of the portion to be held, but have a clearance J comprised between 0.1 and 0.5 mm therewith. The intermediate portions 34 also include orifices 36. The orifices 36 allow more easily recovering the powder and recycling the unused powder at the end of manufacture.

Although the present invention has been described with reference to specific exemplary embodiments, it is obvious that modifications and changes can be made to these examples without departing from the general scope of the invention as defined by the claims. Particularly, individual characteristics of the different illustrated/mentioned embodiments can be combined in additional embodiments. Consequently, the description and the drawings should be considered in an illustrative rather than a restrictive sense.

It is also obvious that all the characteristics described with reference to a method can be transposed, alone or in combination, to a device, and conversely, all the characteristics described with reference to a device can be transposed, alone or in combination, to a method.

The invention claimed is:

1. A method for preparing a digital model for the manufacture of a part by additive manufacturing, the part to be manufactured including at least one portion to be held forming an angle of less than 45° with respect to a building direction of the part to be manufactured, the at least one portion to be held having a first lateral surface and a second lateral surface opposite to each other, the method comprising the following steps:
providing a digital model of the part to be manufactured,
adding to the digital model a plurality of holding elements including a plurality of teeth aligned with respect to each other, and being positioned on one side of the at least one portion to be held such that the teeth are directly in contact with said first lateral surface or said second lateral surface,
wherein the digital model includes intermediate portions disposed between two adjacent holding elements, the intermediate portions having a surface whose shape matches that of the corresponding lateral surface of the at least one portion to be held, and the intermediate portions are not in contact with the lateral surfaces of the at least one portion to be held, and wherein the intermediate portions include orifices.

2. The method according to claim 1, wherein one of the plurality of holding elements is a first holding element positioned on a first side of the portion to be held, so as to be in contact with said first lateral surface, and the digital model comprises at least a second holding element positioned on a second side of the portion to be held so as to be in contact with said second lateral surface.

3. The method according to claim 2, wherein the contact between the first holding element and the first lateral surface, and the contact between the second holding element and the second lateral surface, are linear contacts.

4. The method of claim 2, wherein the first and second holding elements are facing each other.

5. The method according to claim 2, wherein the digital model includes a plurality of first holding elements in contact with the first lateral surface of the portion to be held, and a plurality of second holding elements in contact with the second lateral surface of the portion to be held.

6. The method according to claim 5, wherein each first holding element of the plurality of first holding elements in contact with the first lateral surface of the portion to be held, is positioned facing one of the second holding elements of the plurality of second holding elements in contact with the second lateral surface of the portion to be held.

7. The method according to claim 1, wherein a contact end of the plurality of holding elements in contact with the corresponding lateral surface of the portion to be held, has a thinned shape.

8. The method according to claim 1, wherein at least one tooth of at least one holding element includes a face having an angle comprised between 30° and 70° with respect to the building direction.

9. The method of claim 8, wherein the angle is between 40° and 60°.

10. The method according to claim 1, wherein the plurality of holding elements haves, along the building direction of the part to be manufactured, a decreasing cross-section.

11. The method according to claim 1, wherein the part to be manufactured is an aeronautical part, and wherein the lateral surfaces of the portion to be held are surfaces configured to be in contact with a stream of a working fluid.

12. The method according to claim 11, wherein the aeronautical part is a turbomachine part.

13. The method according to claim 1, wherein the part to be manufactured is a turbomachine airfoil, the first lateral surface being the pressure side of the airfoil, the second lateral surface being the suction side of the airfoil.

14. A method for manufacturing a part by additive manufacturing including the preparation of a digital model obtained using a method according to claim 1, and the manufacture of the part by additive manufacturing.

15. The method according to claim 1, wherein the plurality of holding elements includes between three to ten teeth per cm along a line according to which the teeth are aligned.

16. The method according to claim 1, wherein each tooth includes a bearing face, the bearing face having, in a cross section perpendicular to a longitudinal axis, an angle comprised between 30° and 70° with respect to a building plane.

17. The method according to claim 16, wherein the angle is comprised between 40° and 60° with respect to the building plane.

18. A blank including:
a part having at least one portion to be held forming an angle of less than 45° with respect to a building direction of the part, the at least one portion to be held having a first lateral surface and a second lateral surface opposite to each other, and
a plurality of holding elements, first holding elements element including a plurality of teeth aligned with respect to each other, and being positioned on a first side of the at least one portion to be held, such that the teeth are directly in contact with said first lateral surface, and second holding elements including a plurality of teeth aligned with respect to each other, and being positioned on the at least one portion to be held such that the teeth are directly in contact with said second lateral surface, wherein the blank includes intermediate portions disposed between two adjacent holding elements, the intermediate portions having a surface whose shape matches that of the corresponding lateral surface of the at least one portion to be held, and the intermediate portions are not in contact with the lateral surfaces of the at least one portion to be held, and wherein the intermediate portions include orifices.

* * * * *